United States Patent
Shang et al.

(10) Patent No.: US 11,854,508 B2
(45) Date of Patent: Dec. 26, 2023

(54) DRIVING METHOD AND DEVICE FOR SHIFT REGISTER

(71) Applicant: BOE Technology Group Co., Ltd., Beijing (CN)

(72) Inventors: Guangliang Shang, Beijing (CN); Tian Dong, Beijing (CN); Shuo Huang, Beijing (CN); Can Zheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/921,082

(22) PCT Filed: May 12, 2021

(86) PCT No.: PCT/CN2021/093329
§ 371 (c)(1),
(2) Date: Oct. 24, 2022

(87) PCT Pub. No.: WO2021/254039
PCT Pub. Date: Dec. 23, 2021

(65) Prior Publication Data
US 2023/0178046 A1    Jun. 8, 2023

(30) Foreign Application Priority Data

Jun. 17, 2020 (CN) .......................... 202010552721.9

(51) Int. Cl.
*G09G 3/36* (2006.01)
(52) U.S. Cl.
CPC ... *G09G 3/3674* (2013.01); *G09G 2310/0286* (2013.01)
(58) Field of Classification Search
CPC ......... G09G 3/3674; G09G 2310/0286; G09G 3/20; G09G 2300/0408; G09G 2300/0426; G11C 19/28
See application file for complete search history.

(56) References Cited

U.S. PATENT DOCUMENTS

2007/0070020 A1   3/2007   Edo et al.
2008/0117157 A1   5/2008   Hwang et al.
(Continued)

FOREIGN PATENT DOCUMENTS

| CN | 100555464 C | 10/2009 |
|---|---|---|
| CN | 101552040 A | 10/2009 |
| CN | 104715734 A | 6/2015 |
| CN | 105118414 A | 12/2015 |
| CN | 106548747 A | 3/2017 |
| CN | 107256701 A | 10/2017 |

(Continued)

OTHER PUBLICATIONS

CN202010552721.9 first office action.
PCT/CN2021/093329 international search report.

*Primary Examiner* — Towfiq Elahi
(74) *Attorney, Agent, or Firm* — IPro, PLLC

(57) ABSTRACT

A driving method and device for a shift register. In a data refreshing phase, loading an input signal having a pulse level to an input signal end, loading a control clock pulse signal to a control clock signal end, loading a noise reduction clock pulse signal to a noise reduction clock signal end, controlling a cascade signal end of the shift register to output a cascade signal having a pulse level, and controlling a drive signal end of the shift register to output a drive signal having a pulse level; in a data holding phase, loading a fixed voltage signal to the input signal end, loading a first set signal to the control clock signal end, loading a second set signal to the noise reduction clock signal end, controlling the cascade signal end to output a fixed voltage signal having a second level.

18 Claims, 7 Drawing Sheets

(56) References Cited

U.S. PATENT DOCUMENTS

| | | |
|---|---|---|
| 2011/0142192 A1 | 6/2011 | Lin et al. |
| 2011/0216874 A1 | 9/2011 | Toyotaka |
| 2012/0269315 A1 | 10/2012 | Jang et al. |
| 2015/0170578 A1 | 6/2015 | Choi |
| 2015/0187269 A1 | 7/2015 | Hu et al. |
| 2016/0307641 A1 | 10/2016 | Zheng et al. |
| 2016/0334923 A1 | 11/2016 | Chan |
| 2017/0270892 A1 | 9/2017 | Wang |
| 2018/0090043 A1 | 3/2018 | Zhou et al. |
| 2018/0144697 A1 | 5/2018 | Kim et al. |
| 2019/0189234 A1 | 6/2019 | Chen et al. |
| 2019/0287446 A1 | 9/2019 | Liao et al. |
| 2020/0111439 A1 | 4/2020 | Kim et al. |
| 2020/0160767 A1 | 5/2020 | Mi et al. |
| 2020/0243151 A1 | 7/2020 | Li et al. |
| 2021/0335196 A1 | 10/2021 | Tao et al. |

FOREIGN PATENT DOCUMENTS

| | | |
|---|---|---|
| CN | 107464519 A | 12/2017 |
| CN | 107481659 A | 12/2017 |
| CN | 108288451 A | 7/2018 |
| CN | 108389539 A | 8/2018 |
| CN | 108682379 A | 10/2018 |
| CN | 108831403 A | 11/2018 |
| CN | 110599971 A | 12/2019 |
| CN | 111145823 A | 5/2020 |
| CN | 111583885 A | 8/2020 |
| JP | 2009098430 A | 5/2009 |
| KR | 20080045498 A | 5/2008 |
| KR | 20120111643 A | 10/2012 |
| KR | 20120119456 A | 10/2012 |
| KR | 20150069804 A | 6/2015 |
| KR | 20180056458 A | 5/2018 |
| TW | 201121241 A | 6/2011 |
| TW | 201810288 A | 3/2018 |
| WO | 03034390 A2 | 4/2003 |

S210 — in the data refreshing phase, loading an input signal having a pulse level to an input signal end, loading a control clock pulse signal to a control clock signal end, loading a noise reduction clock pulse signal to a noise reduction clock signal end, loading a fixed voltage signal having a first level to a first reference signal end, loading a fixed voltage signal having a second level to a second reference signal end, controlling a cascade signal end of the shift register to output a cascade signal having a pulse level, and controlling a drive signal end of the shift register to output a drive signal having a pulse level S220 — in the data holding phase, loading a fixed voltage signal to the input signal end, loading a first set signal to the control clock signal end, loading a second set signal to the noise reduction clock signal end, loading the fixed voltage signal having the first level to the first reference signal end, loading the fixed voltage signal having the second level to the second reference signal end, controlling the cascade signal end to output the fixed voltage signal having the second level, and controlling the drive signal end to output the fixed voltage signal having the first level.

Fig. 2

DRIVING METHOD AND DEVICE FOR SHIFT REGISTER

CROSS REFERENCE TO RELATED APPLICATION

The present application is a national phase entry under 35 U.S.C § 371 of International Application No. PCT/CN2021/093329, filed May 12, 2021, which claims the priority to Chinese Patent Application No. 202010552721.9, filed to the China National Intellectual Property Administration on Jun. 17, 2020 and entitled "DRIVING METHOD AND DEVICE FOR SHIFT REGISTER", which is incorporated in its entirety herein by reference.

FIELD

The present disclosure relates to the technical field of display, and particularly relates to a driving method and device for a shift register.

BACKGROUND

Owing to rapid development of the display technology, display devices have been developing towards higher integration level and lower cost. The gate driver on array (GOA) technology integrates a thin film transistor (TFT) gate drive circuit on an array substrate of a display device to form scanning drive for the display device. The gate drive circuit is generally composed of a plurality of shift registers that are cascaded. However, high power consumption of a shift register will lead to high power consumption of a display device.

SUMMARY

Embodiments of the present disclosure provide a driving method for a shift register. The driving method includes: under a condition that at first refreshing frequency, a display frame includes a data refreshing phase and a data holding phase.

In the data refreshing phase, loading an input signal having a pulse level to an input signal end, loading a control clock pulse signal to a control clock signal end, loading a noise reduction clock pulse signal to a noise reduction clock signal end, loading a fixed voltage signal having a first level to a first reference signal end, loading a fixed voltage signal having a second level to a second reference signal end, controlling a cascade signal end of the shift register to output a cascade signal having a pulse level, and controlling a drive signal end of the shift register to output a drive signal having a pulse level.

In the data holding phase, loading a fixed voltage signal to the input signal end, loading a first set signal to the control clock signal end, loading a second set signal to the noise reduction clock signal end, loading the fixed voltage signal having the first level to the first reference signal end, loading the fixed voltage signal having the second level to the second reference signal end, controlling the cascade signal end to output the fixed voltage signal having the second level, and controlling the drive signal end to output the fixed voltage signal having the first level.

The control clock pulse signal has the first level, the second level and a first clock period, the first set signal has a first set level, where the first clock period includes a duration of one first level and a duration of one second level of the control clock pulse signal, one of the first level and the second level of the control clock pulse signal is a control clock pulse level, the control clock pulse level is the same as the first set level, and a maintaining duration of the first set level in the first clock period is longer than a maintaining duration of the control clock pulse level in the first clock period.

And/or, the noise reduction clock pulse signal has a first level, a second level and a second clock period, the second set signal has a second set level, where the second clock period includes a duration of one first level and a duration of one second level of the noise reduction clock pulse signal, one of the first level and the second level of the noise reduction clock pulse signal is a noise reduction clock pulse level, the noise reduction clock pulse level is the same as the second set level, and a maintaining duration of the second set level in the second clock period is longer than a maintaining duration of the noise reduction clock pulse level in the second clock period.

In some examples, the first set signal is a clock pulse signal, and the first set level is one of the first level and the second level.

In some examples, a third clock period of the first set signal is longer than the first clock period, and the third clock period includes a duration of one first level and a duration of one second level of the first set signal.

In some examples, a maintaining duration of the first level of the first set signal in the first clock period is longer than a maintaining duration of the first level of the control clock pulse signal in the first clock period; and a maintaining duration of the second level of the first set signal in the first clock period is longer than a maintaining duration of the second level of the control clock pulse signal in the first clock period.

In some examples, the second set signal is a clock pulse signal, and the second set level is one of the first level and the second level.

In some examples, a fourth clock period of the second set signal is longer than the second clock period, and the fourth clock period includes a duration of one first level and a duration of one second level of the second set signal.

In some examples, a maintaining duration of the first level of the second set signal in the second clock period is longer than a maintaining duration of the first level of the noise reduction clock pulse signal in the second clock period; and a maintaining duration of the second level of the second set signal in the second clock period is longer than a maintaining duration of the second level of the noise reduction clock pulse signal in the second clock period.

In some examples, a third clock period of the first set signal is the same as the fourth clock period of the second set signal.

In some examples, at least one of the first set signal and the second set signal is a fixed voltage signal; and at least one of the first set level and the second set level is one of the first level and the second level.

In some examples, the first level is a high level, and the second level is a low level; or, the first level is a low level, and the second level is a high level.

In some examples, the driving method further includes: under a condition that at second refreshing frequency, a display frame includes a data refreshing phase, in the data refreshing phase, loading the input signal having the pulse level to the input signal end, loading the control clock pulse signal to the control clock signal end, loading the noise reduction clock pulse signal to the noise reduction clock signal end, loading the fixed voltage signal having the first level to the first reference signal end, loading the fixed voltage signal having the second level to the second reference signal end, controlling the cascade signal end of the shift register to output the cascade signal having the pulse level, and controlling the drive signal end of the shift register to output the drive signal having the pulse level.

The embodiments of the present disclosure provide a driving circuit for a shift register. At first refreshing frequency, a display frame includes a data refreshing phase and a data holding phase; and the driving circuit is configured to:

in the data refreshing phase, load an input signal having a pulse level to an input signal end, load a control clock pulse signal to a control clock signal end, load a noise reduction clock pulse signal to a noise reduction clock signal end, load a fixed voltage signal having a first level to a first reference signal end, load a fixed voltage signal having a second level to a second reference signal end, control a cascade signal end of the shift register to output a cascade signal having a pulse level, and control a drive signal end of the shift register to output a drive signal having a pulse level; and in the data holding phase, load a fixed voltage signal to the input signal end, load a first set signal to the control clock signal end, load a second set signal to the noise reduction clock signal end, load the fixed voltage signal having the first level to the first reference signal end, load the fixed voltage signal having the second level to the second reference signal end, control the cascade signal end to output the fixed voltage signal having the second level, and control the drive signal end to output the fixed voltage signal having the first level.

The control clock pulse signal has the first level, the second level and a first clock period, the first set signal has a first set level, where the first clock period includes a duration of one first level and a duration of one second level of the control clock pulse signal, one of the first level and the second level of the control clock pulse signal is a control clock pulse level, the control clock pulse level is the same as the first set level, and a maintaining duration of the first set level in the first clock period is longer than a maintaining duration of the control clock pulse level in the first clock period.

And/or, the noise reduction clock pulse signal has the first level, a second level and a second clock period, the second set signal has a second set level, where the second clock period includes a duration of one first level and a duration of one second level of the noise reduction clock pulse signal, one of the first level and the second level of the noise reduction clock pulse signal is a noise reduction clock pulse level, the noise reduction clock pulse level is the same as the second set level, and a maintaining duration of the second set level in the second clock period is longer than a maintaining duration of the noise reduction clock pulse level in the second clock period.

In some examples, at second refreshing frequency, a display frame includes the data refreshing phase; and the driving circuit is further configured to:

in the data refreshing phase, load the input signal having the pulse level to the input signal end, load the control clock pulse signal to the control clock signal end, load the noise reduction clock pulse signal to the noise reduction clock signal end, load the fixed voltage signal having the first level to the first reference signal end, load the fixed voltage signal having the second level to the second reference signal end, control the cascade signal end of the shift register to output the cascade signal having the pulse level, and control the drive signal end of the shift register to output the drive signal having the pulse level.

The embodiments of the present disclosure provide a display panel. The display panel includes a gate drive circuit and the driving circuit described above, where the gate drive circuit includes a plurality of shift registers that are cascaded; and the driving circuit is electrically connected to the plurality of shift registers.

The embodiments of the present disclosure provide a display device. The display device includes a display panel.

BRIEF DESCRIPTION OF THE DRAWINGS

FIG. 2 is a flowchart of a driving method provided in an embodiment of the present disclosure.

DETAILED DESCRIPTION OF THE EMBODIMENTS

Figure 1:
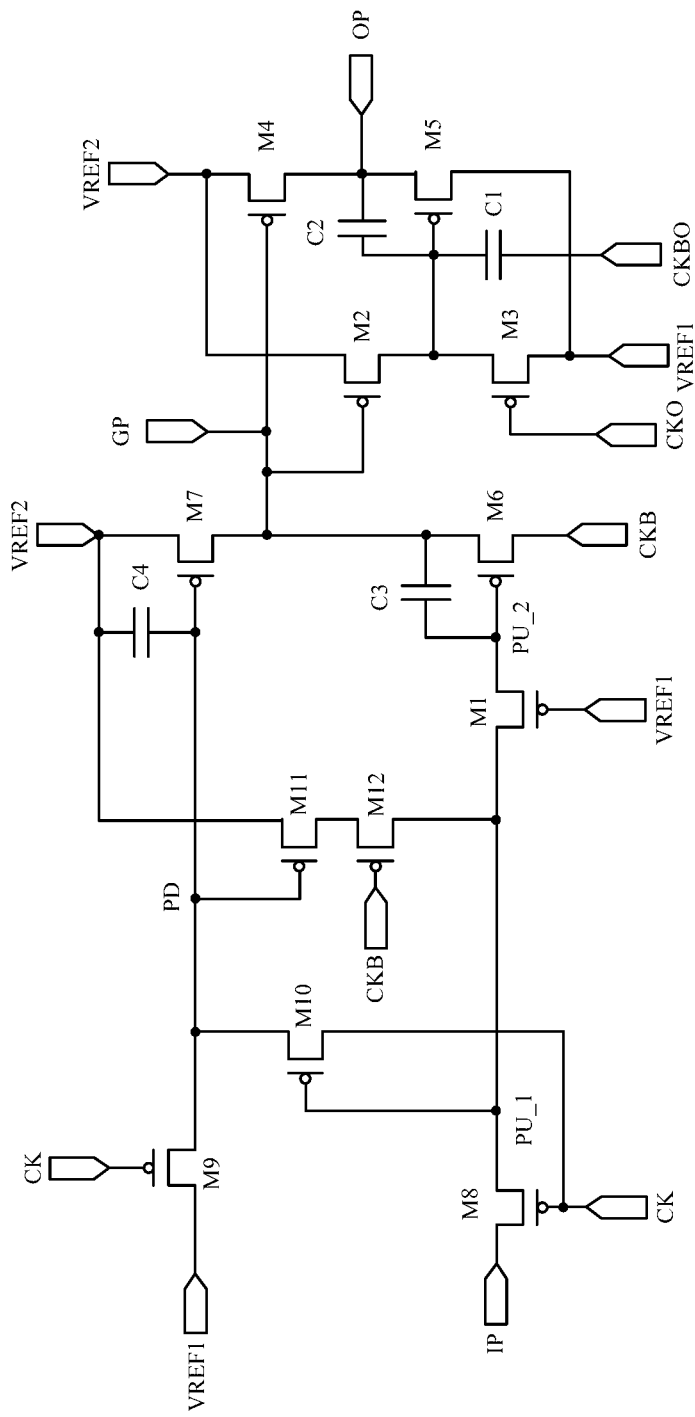
FIG. 1 is a schematic structural diagram of a shift register provided in an embodiment of the present disclosure.

To make the objectives, technical solutions, and advantages in embodiments of the present disclosure clearer, the technical solutions in the embodiments of the present disclosure will be clearly and completely described below with reference to the accompanying drawings in the embodiments of the present disclosure. It is obvious that the described embodiments are some rather than all of the embodiments of the present disclosure. Moreover, the embodiments of the present disclosure and features in the embodiments can be combined with one another without conflict. Based on the described embodiments of the present disclosure, all other embodiments obtained by those of ordinary skill in the art without inventive efforts fall within the scope of protection of the present disclosure.

Unless otherwise defined, technical terms or scientific terms used in the present disclosure should have ordinary meanings understood by those of ordinary skill in the art to which the present disclosure belongs. Words "first", "second" etc. used in the present disclosure do not denote any order, quantity, or importance, but are merely used for distinguishing between different components. Words "comprising", "encompassing", etc., are intended to mean that an element or item in front of the word encompasses elements or items that are listed behind the word and equivalents thereof, but do not exclude other elements or items. Words "connection", "connected", etc. are not limited to a physical or mechanical connection, but can include an electrical connection, whether direct or indirect.

It should be noted that dimensions and shapes of all graphs in the accompanying drawings do not reflect true ratios, and are merely intended to illustrate contents of the present disclosure. Moreover, the same or similar reference numerals denote the same or similar elements or elements having the same or similar function throughout.

Generally, in order to reduce power consumption of a display device, the display device may be driven at lower refreshing frequency (such as 1 Hz). Due to long-term leakage accumulation of a transistor, a signal output from a drive signal end is abnormal.

The embodiments of the present disclosure provide some shift registers. As shown in FIG. 1, the shift register may include the following elements.

A first transistor M1, where a gate electrode of the first transistor M1 is coupled to a first reference signal end VREF1, a first electrode of the first transistor M1 is coupled to a first pull-up node PU_1, and a second electrode of the first transistor M1 is coupled to a second pull-up node PU_2.

A second transistor M2, where a gate electrode of the second transistor M2 is coupled to a cascade signal end GP, a first electrode of the second transistor M2 is coupled to a second reference signal end VREF2, and a second electrode of the second transistor M2 is coupled to a gate electrode of a fifth transistor M5.

A third transistor M3, where a gate electrode of the third transistor M3 is coupled to a first noise reduction clock signal end CKO, a first electrode of the third transistor M3 is coupled to the first reference signal end VREF1, and a second electrode of the third transistor M3 is coupled to the gate electrode of the fifth transistor M5.

A fourth transistor M4, where a gate electrode of the fourth transistor M4 is coupled to the cascade signal end GP, a first electrode of the fourth transistor M4 is coupled to the second reference signal end VREF2, and a second electrode of the fourth transistor M4 is coupled to a drive signal end OP.

The fifth transistor M5, where a first electrode of the fifth transistor M5 is coupled to the first reference signal end VREF1, and a second electrode of the fifth transistor M5 is coupled to the drive signal end OP.

A first capacitor C1, where a first electrode of the first capacitor C1 is coupled to a second noise reduction clock signal end CKBO, and a second electrode of the first capacitor C1 is coupled to the gate electrode of the fifth transistor M5.

A second capacitor C2, where a first electrode of the second capacitor C2 is coupled to the gate electrode of the fifth transistor M5, and a second electrode of the second capacitor C2 is coupled to the drive signal end OP.

A sixth transistor M6, where a gate electrode of the sixth transistor M6 is coupled to the second pull-up node PU_2, a first electrode of the sixth transistor M6 is coupled to a second control clock signal end CKB, and a second electrode of the sixth transistor M6 is coupled to the cascade signal end GP.

A seventh transistor M7, where a gate electrode of the seventh transistor M7 is coupled to a pull-down node PD, a first electrode of the seventh transistor M7 is coupled to the second reference signal end VREF2, and a second electrode of the seventh transistor M7 is coupled to the cascade signal end GP.

A third capacitor C3, where a first electrode of the third capacitor C3 is coupled to the second pull-up node PU_2, and a second electrode of the third capacitor C3 is coupled to the cascade signal end GP.

A fourth capacitor C4, where a first electrode of the fourth capacitor C4 is coupled to the pull-down node PD, and a second electrode of the fourth capacitor C4 is coupled to the second reference signal end VREF2.

An eighth transistor M8, where a gate electrode of the eighth transistor M8 is coupled to a first control clock signal end CK, a first electrode of the eighth transistor M8 is coupled to an input signal end IP, and a second electrode of the eighth transistor M8 is coupled to the first pull-up node PU_1.

A ninth transistor M9, where a gate electrode of the ninth transistor M9 is coupled to the first control clock signal end CK, a first electrode of the ninth transistor M9 is coupled to the first reference signal end VREF1, and a second electrode of the ninth transistor M9 is coupled to the pull-down node PD.

A tenth transistor M10, where a gate electrode of the tenth transistor M10 is coupled to the first pull-up node PU_1, a first electrode of the tenth transistor M10 is coupled to the first control clock signal end CK, and a second electrode of the tenth transistor M10 is coupled to the pull-down node PD.

An eleventh transistor M11, where a gate electrode of the eleventh transistor M11 is coupled to the pull-down node PD, a first electrode of the eleventh transistor M11 is coupled to the second reference signal end VREF2, and a second electrode of the eleventh transistor M11 is coupled to a first electrode of a twelfth transistor M12.

The twelfth transistor M12, where a gate electrode of the twelfth transistor M12 is coupled to the second control clock signal end CKB, and a second electrode of the twelfth transistor M12 is coupled to the first pull-up node PU_1.

During specific implementation, as shown in FIG. 1, the first pull-up node PU_1 is coupled between the second electrode of the eighth transistor M8 and the first electrode of the first transistor M1. The second pull-up node PU_2 is coupled between the gate electrode of the sixth transistor M6 and the second electrode of the first transistor M1. The pull-down node PD is coupled between the second electrode of the ninth transistor M9 and the gate electrode of the seventh transistor M7. It should be noted that the first pull-up node PU_1, the second pull-up node PU_2 and the pull-down node PD are virtual nodes in the shift register. The three nodes are merely for convenience of describing a structure of the shift register and signal transmission, and a specific structure of the shift register and signal transmission may be determined according to a coupling mode between each transistor and the capacitor in the shift register.

According to the shift register provided in the embodiment of the present disclosure, a corresponding signal is loaded to each signal end, such that each transistor and the capacitor work together in a cooperative manner, and a cascade signal end and a drive signal end may output corresponding signals separately. In addition, power consumption of the shift register may be further reduced, such that the shift register in the present application may be advantageously used in a display device having lower refreshing frequency.

During specific implementation, according to a flow direction of a signal, for each of the transistors, the first electrode may be used as a source electrode and the second electrode may be used as a drain electrode; and alternatively, the first electrode may be used as a drain electrode and the second electrode may be used as a source electrode, which are not specifically distinguished herein.

It should be noted that each of the transistors mentioned in the embodiments of the present disclosure may be a thin film transistor (TFT) or a metal oxide semiconductor (MOS) field effect transistor, which is not limited herein.

To reduce a manufacturing process, during specific implementation, in the embodiments of the present disclosure, each transistor may be a P-type transistor, as shown in FIG. 1. The P-type transistor is turned on when a voltage difference $V_{gs}$ between a gate electrode and a source electrode of the P-type transistor and a threshold voltage $V_{th}$ satisfy $V_{gs}<V_{th}$. For example, when the third transistor M3 is a P-type transistor, the third transistor M3 is turned on when a voltage difference $V_{gs3}$ between a gate electrode and a source electrode thereof and a threshold voltage $V_{th3}$ satisfy $V_{gs3}<V_{th3}$. Certainly, the embodiments of the present disclosure merely takes the transistors as the P-type transistors as an example for illustration. When the transistors are N-type transistors, a design principle therefor is the same as that of the present disclosure, and also belongs to the scope of protection of the present disclosure. In addition, each N-type transistor is turned on when a voltage difference $V_{gs}$ between a gate electrode and a source electrode thereof and a threshold voltage $V_{th}$ satisfy $V_{gs}>V_{th}$. For example, when the third transistor M3 is an N-type transistor, the third transistor M3 is turned on when a voltage difference $V_{gs3}$ between a gate electrode and a source electrode thereof and a threshold voltage $V_{th3}$ satisfy $V_{gs3}>V_{th3}$.

Furthermore, during specific implementation, the P-type transistor is turned off under an effect of a high-level signal and turned on under an effect of a low-level signal. The N-type transistor is turned on under an effect of a high-level signal and turned off under an effect of a low-level signal.

During specific implementation, a width-to-length ratio of a channel region of an active layer of at least one of the fourth transistor M4, the fifth transistor M5, the sixth transistor M6 and the seventh transistor M7 may be greater than that of a channel region of an active layer of at least one of the first transistor M1, the second transistor M2, the third transistor M3, the eighth transistor M8, the ninth transistor M9, the tenth transistor M10, the eleventh transistor M11 and the twelfth transistor M12. For example, a width-to-length ratio of a channel region of an active layer of the fourth transistor M4, a width-to-length ratio of a channel region of an active layer of the fifth transistor M5, a width-to-length ratio of a channel region of an active layer of the sixth transistor M6 and a width-to-length ratio of a channel region of an active layer of the seventh transistor M7 may be greater than a width-to-length ratio of a channel region of an active layer of the first transistor M1, a width-to-length ratio of a channel region of an active layer of the second transistor M2, a width-to-length ratio of a channel region of an active layer of the third transistor M3, a width-to-length ratio of a channel region of an active layer of the eighth transistor M8, a width-to-length ratio of a channel region of an active layer of the ninth transistor M9, a width-to-length ratio of a channel region of an active layer of the tenth transistor M10, a width-to-length ratio of a channel region of an active layer of the eleventh transistor M11 and a width-to-length ratio of a channel region of an active layer of the twelfth transistor M12.

During specific implementation, the width-to-length ratio of the channel region of the active layer of the at least one of the fourth transistor M4, the fifth transistor M5, the sixth transistor M6 and the seventh transistor M7 may range from 10 μm/2 μm to 100 μm/10 μm. For example, each of the width-to-length ratio of the channel region of the active layer of the fourth transistor M4, the width-to-length ratio of the channel region of the active layer of the fifth transistor M5, the width-to-length ratio of the channel region of the active layer of the sixth transistor M6 and the width-to-length ratio of the channel region of the active layer of the seventh transistor M7 may be 10 μm/2 μm. Also, each of the width-to-length ratio of the channel region of the active layer of the fourth transistor M4, the width-to-length ratio of the channel region of the active layer of the fifth transistor M5, the width-to-length ratio of the channel region of the active layer of the sixth transistor M6 and the width-to-length ratio of the channel region of the active layer of the seventh transistor M7 may be 100 μm/10 μm. Also, each of the width-to-length ratio of the channel region of the active layer of the fourth transistor M4, the width-to-length ratio of the channel region of the active layer of the fifth transistor M5, the width-to-length ratio of the channel region of the active layer of the sixth transistor M6 and the width-to-length ratio of the channel region of the active layer of the seventh transistor M7 may be 50 μm/5 μm.

Certainly, in actual use, the width-to-length ratio of the channel region of the active layer of the fourth transistor M4, the width-to-length ratio of the channel region of the active layer of the fifth transistor M5, the width-to-length ratio of the channel region of the active layer of the sixth transistor M6 and the width-to-length ratio of the channel region of the active layer of the seventh transistor M7 may be specifically designed according to requirements of the actual use, which are not limited herein.

During specific implementation, the width-to-length ratio of the channel region of the active layer of the at least one of the first transistor M1, the second transistor M2, the third transistor M3, the eighth transistor M8, the ninth transistor M9, the tenth transistor M10, the eleventh transistor M11 and the twelfth transistor M12 may be 2 μm/2 μm to 20 μm/10 μm. For example, the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11 and the width-to-length ratio of the channel region of the active layer of the twelfth transistor M12 may range from 2 μm/2 μm to 20 μm/10 μm. For example, the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11 and the width-to-length ratio of the channel region of the active layer of the twelfth transistor M12 may be 2 μm/2 μm. Also, the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11 and the width-to-length ratio of the channel region of the active layer of the twelfth transistor M12 may be 20 µm/10 µm. Also, the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11 and the width-to-length ratio of the channel region of the active layer of the twelfth transistor M12 may be 10 µm/5 µm.

Certainly, in actual use, the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11 and the width-to-length ratio of the channel region of the active layer of the twelfth transistor M12 may be specifically designed according to actual use requirements, which are not limited herein.

During specific implementation, a capacitance of at least one of the first capacitor C1, the second capacitor C2, the third capacitor C3 and the fourth capacitor C4 may ranges from 10 fF to 1 pF. For example, the capacitance of the at least one of the first capacitor C1, the second capacitor C2, the third capacitor C3 and the fourth capacitor C4 may be 10 fF. Also, the capacitance of the at least one of the first capacitor C1, the second capacitor C2, the third capacitor C3 and the fourth capacitor C4 may be 50 fF. Also, the capacitance of the at least one of the first capacitor C1, the second capacitor C2, the third capacitor C3 and the fourth capacitor C4 may be 1 pF. Certainly, in actual use, a capacitance of the first capacitor C1, a capacitance of the second capacitor C2, a capacitance of the third capacitor C3 and a capacitance of the fourth capacitor C4 may be specifically designed according to requirements of the actual use, which are not limited herein.

What is described above is just an example to illustrate a specific structure of the shift register provided in the embodiment of the present disclosure. During specific implementation, specific structures of the above circuits are not limited to the above structures provided in the embodiment of the present disclosure, but can also be other structures known to those skilled in the art, which are not limited herein.

Figure 3:
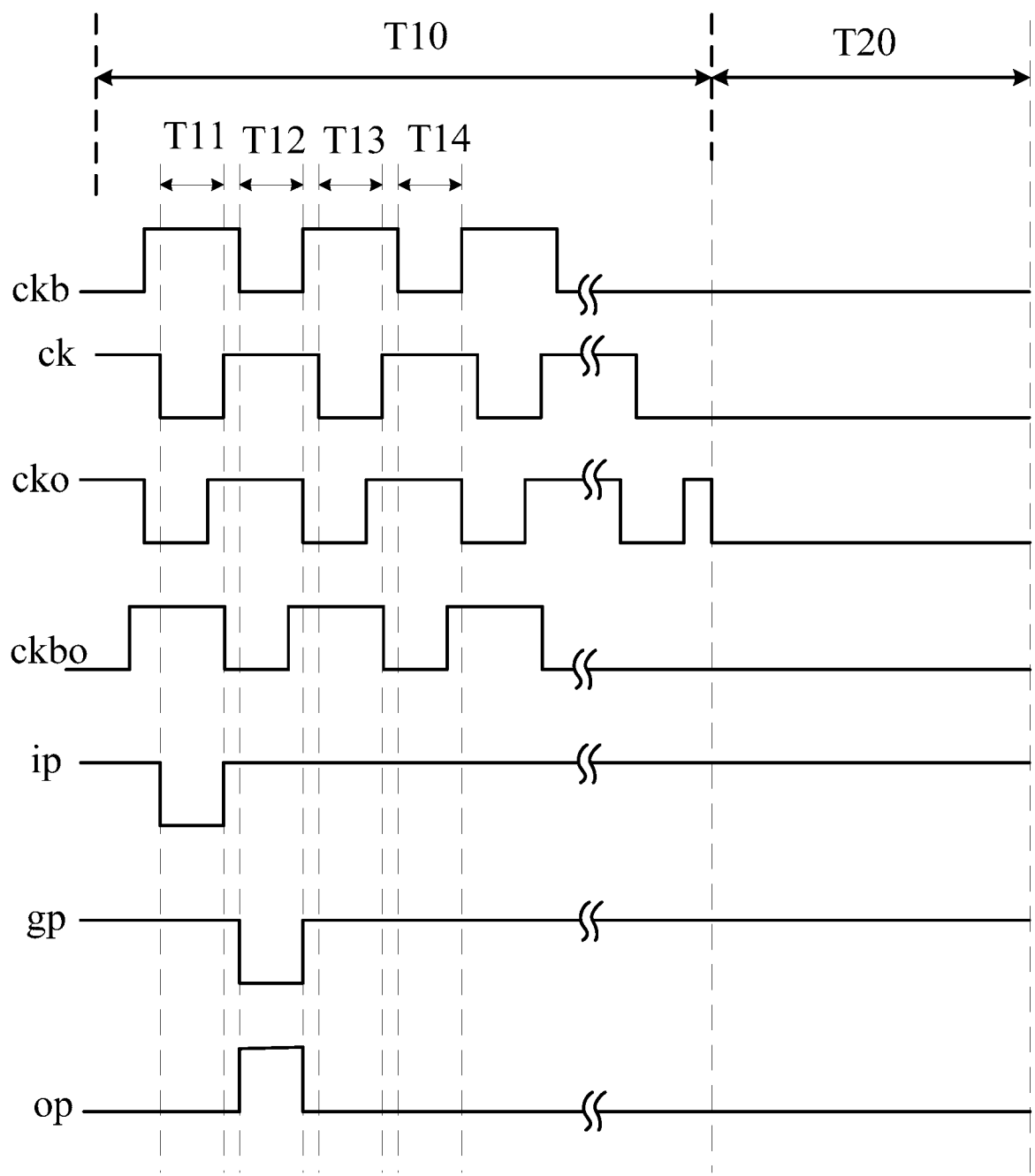
FIG. 3 shows some signal sequence diagrams provided in an embodiment of the present disclosure.

The embodiments of the present disclosure further provide a driving method for a shift register. As shown in FIGS. 2 and 3, at first refreshing frequency, a display frame includes a data refreshing phase T10 and a data holding phase T20.

The driving method may include the following steps.

S210, in the data refreshing phase, loading an input signal having a pulse level to an input signal end, loading a control clock pulse signal to a control clock signal end, loading a noise reduction clock pulse signal to a noise reduction clock signal end, loading a fixed voltage signal having a first level to a first reference signal end, loading a fixed voltage signal having a second level to a second reference signal end, controlling a cascade signal end of the shift register to output a cascade signal having a pulse level, and controlling a drive signal end of the shift register to output a drive signal having a pulse level.

S220, in the data holding phase, loading a fixed voltage signal to the input signal end, loading a first set signal to the control clock signal end, loading a second set signal to the noise reduction clock signal end, loading the fixed voltage signal having the first level to the first reference signal end, loading the fixed voltage signal having the second level to the second reference signal end, controlling the cascade signal end to output the fixed voltage signal having the second level, and controlling the drive signal end to output the fixed voltage signal having the first level.

According to the driving method for a shift register provided in the embodiments of the present disclosure, in the data refreshing phase T10, the input signal having the pulse level is loaded to the input signal end, the control clock pulse signal is loaded to the control clock signal end, the noise reduction clock pulse signal is loaded to the noise reduction clock signal end, the fixed voltage signal having the first level is loaded to the first reference signal end, the fixed voltage signal having the second level is loaded to the second reference signal end, the cascade signal end of the shift register is controlled to output the cascade signal having the pulse level, and the drive signal end of the shift register is controlled to output the drive signal having the pulse level. In this way, cascade output and drive output of the shift register may be implemented, such that the display device may refresh data.

In addition, in the data holding phase, the fixed voltage signal is loaded to the input signal end, the first set signal is loaded to the control clock signal end, the second set signal is loaded to the noise reduction clock signal end, the fixed voltage signal having the first level is loaded to the first reference signal end, the fixed voltage signal having the second level is loaded to the second reference signal end, the cascade signal end is controlled to output the fixed voltage signal having the second level, and the drive signal end is controlled to output the fixed voltage signal having the first level.

For example, the control clock pulse signal is a clock pulse signal having the first level and the second level that are alternately switched. In addition, the control clock pulse signal has a first clock period, and the first level and the second level are switched in the first clock period. The first clock period includes a duration of one first level and a duration of one second level of the control clock pulse signal. One of the first level and the second level of the control clock pulse signal may be a control clock pulse level, and the first set signal has a first set level. The control clock pulse level is the same as the first set level, and a maintaining duration of the first set level in the first clock period is longer than a maintaining duration of the control clock pulse level in the first clock period. In this way, frequency of level switching of the first set signal in the data holding phase may be reduced, such that power consumption may be decreased.

For example, the noise reduction clock pulse signal is a clock pulse signal having the first level and the second level that are alternately switched. In addition, the noise reduction clock pulse signal has a second clock period, and the first level and the second level are switched in the second clock period. The second clock period includes a duration of one first level and a duration of one second level of the noise reduction clock pulse signal. One of the first level and the second level of the noise reduction clock pulse signal may be a noise reduction clock pulse level, and the second set signal has a second set level. The noise reduction clock pulse level is the same as the second set level, and a maintaining duration of the second set level in the second clock period is longer than a maintaining duration of the noise reduction clock pulse level in the second clock period. In this way, frequency of level switching of the second set signal in the data holding phase may be reduced, such that power consumption may be decreased.

Generally, the display device may be in a static image display state or standby state for a long time. In order to reduce power consumption, the display device may be operated at lower refreshing frequency (such as 1 Hz or 30 Hz). According to the shift register in the embodiments of the present disclosure, the first set signal and the second set signal are loaded in the data holding phase, such that power consumption may be reduced, and then the shift register in the present application may be advantageously used in a display device having lower refreshing frequency.

During specific implementation, in the embodiments of the present disclosure, the first level may a low level, and the second level may be a high level. Alternatively, the first level may also be a high level, and the second level may also be a low level. In actual use, design and determination may be conducted according to actual use requirements, which is not limited herein.

During specific implementation, in the embodiments of the present disclosure, the driving method further includes the following steps that under a condition that at second refreshing frequency, a display frame includes a data refreshing phase T10, in the data refreshing phase, loading the input signal having the pulse level to the input signal end, loading the control clock pulse signal to the control clock signal end, loading the noise reduction clock pulse signal to the noise reduction clock signal end, loading the fixed voltage signal having the first level to the first reference signal end, loading the fixed voltage signal having the second level to the second reference signal end, controlling the cascade signal end of the shift register to output the cascade signal having the pulse level, and controlling the drive signal end of the shift register to output the drive signal having the pulse level.

Generally, the display device may be in a static image display state or standby state for a long time. In order to reduce power consumption, the display device may be operated at lower refreshing frequency (such as 1 Hz or 30 Hz). Certainly, the display device may also display video images. In order to improve a display effect of the video images, the display device may be operated at higher refreshing frequency (such as 60 Hz or 120 Hz). During specific implementation, in the embodiments of the present disclosure, the first refreshing frequency may be lower refreshing frequency, such as 1 Hz or 30 Hz. The second refreshing frequency may be higher refreshing frequency, such as 60 Hz or 120 Hz.

During specific implementation, in the embodiments of the present disclosure, the control clock signal end includes the first control clock signal end CK and the second control clock signal end CKB; and the control clock pulse signal includes a first control clock pulse signal and a second control clock pulse signal. Each of periods of the first control clock pulse signal and the second control clock pulse signal is the first clock period, and a phase difference between the period of the first noise reduction clock pulse signal and the period of the second noise reduction clock pulse signal is ½ period. In addition, in the data refreshing phase T10, the control clock pulse signal is loaded to the control clock signal end, which may specifically include the following steps that the first control clock pulse signal is loaded to the first control clock signal end CK, and the second control clock pulse signal is loaded to the second control clock signal end CKB.

For example, as shown in FIGS. 1 and 3, ck represents a signal loaded by the first control clock signal end CK, and ckb represents a signal loaded by the second control clock signal end CKB. In the data refreshing phase T10, the first control clock pulse signal loaded by the first control clock signal end CK is a clock pulse signal having a high level and a low level that are switched, and the second control clock pulse signal loaded by the second control clock signal end CKB is also a clock pulse signal having the high level and the low level that are switched. In addition, the first control clock pulse signal and the second control clock pulse signal have the same period and a phase difference of a ½ period. For example, a duty cycle of the first control clock pulse signal is the same as a duty cycle of the second control clock pulse signal, and the duty cycle is greater than 50%. Certainly, in actual use, specific implementation modes of the first control clock pulse signal and the second control clock pulse signal may be designed and determined according to actual use requirements, which are not limited herein.

During specific implementation, in the embodiments of the present disclosure, in the data holding phase, the fixed voltage signal is loaded to the input signal end IP, which may include the following step that the fixed voltage signal having the second level is loaded to the input signal end IP. For example, as shown in FIGS. 1 and 3, ip represents a signal loaded by the input signal end IP. When a transistor in the shift register is a P-type transistor, the fixed voltage signal having the high level may be loaded to the input signal end IP. When a transistor in the shift register is an N-type transistor, the fixed voltage signal having the low level may be loaded to the input signal end IP.

During specific implementation, in the embodiments of the present disclosure, in the data holding phase, the cascade signal end GP is controlled to output a fixed voltage signal, and the drive signal end OP is controlled to output a fixed voltage signal, which may include the following steps that the cascade signal end GP is controlled to output the fixed voltage signal having the second level, and the drive signal end OP is controlled to output the fixed voltage signal having the first level. For example, as shown in FIGS. 1 and 3, gp represents a signal output from the cascade signal end GP, and op represents a signal output from the drive signal end OP. When a transistor in the shift register is a P-type transistor, the cascade signal end GP may be controlled to output the fixed voltage signal having a high level, and the drive signal end OP may be controlled to output the fixed voltage signal having a low level. When a transistor in the shift register is an N-type transistor, the cascade signal end GP may be controlled to output the fixed voltage signal having a low level, and the drive signal end OP may be controlled to output the fixed voltage signal having a high level.

During specific implementation, in the embodiments of the present disclosure, the pulse level of the input signal may be the first level. In this way, when the eighth transistor M8 is turned on, the pulse level of the input signal may be input to the first pull-up node PU_1, such that a level of the first pull-up node PU_1 is the first level, and the tenth transistor M10 may be controlled to be turned on by the level of the first pull-up node PU_1. For example, as shown in FIGS. 1 and 3, when a transistor in the shift register is a P-type transistor, the pulse level of the input signal is a low level. When a transistor in the shift register is an N-type transistor, the pulse level of the input signal is a high level.

During specific implementation, in the embodiments of the present disclosure, the pulse level of the cascade signal may be the first level. In this way, the fourth transistor M4 may be controlled to be turned on by the pulse level of the cascade signal, and a signal of the second reference signal end VREF2 is supplied to the drive signal end OP. For example, as shown in FIGS. 1 and 3, when a transistor in the shift register is a P-type transistor, the pulse level of the cascade signal is a low level. When a transistor in the shift register is an N-type transistor, the pulse level of the cascade signal is a high level.

During specific implementation, in the embodiments of the present disclosure, the fixed voltage signal of the first reference signal end VREF1 may have the first level, the fixed voltage signal of the second reference signal end VREF2 may have the second level, and the pulse level of the drive signal may have the second level. For example, as shown in FIGS. 1 and 3, when a transistor in the shift register is a P-type transistor, the first level is a low level and the second level is a high level. When a transistor in the shift register is an N-type transistor, the first level is a high level and the second level is a low level.

During specific implementation, in the embodiments of the present disclosure, the noise reduction clock signal end may include the first noise reduction clock signal end CKO and the second noise reduction clock signal end CKBO. The noise reduction clock pulse signal includes a first noise reduction clock pulse signal and a second noise reduction clock pulse signal. Each of periods of the first noise reduction clock pulse signal and the second noise reduction clock pulse signal is the second clock period, and a phase difference between the period of the first noise reduction clock pulse signal and the period of the second noise reduction clock pulse signal is ½ period. In addition, in the data refreshing phase T10, the noise reduction clock pulse signal is loaded to the noise reduction clock signal end, which may include the following steps that the first noise reduction clock pulse signal is loaded to the first noise reduction clock signal end CKO, and the second noise reduction clock pulse signal is loaded to the second noise reduction clock signal end CKBO.

For example, as shown in FIGS. 1 and 3, cko represents a signal loaded by the first noise reduction clock signal end CKO, and ckbo represents a signal loaded by the second noise reduction clock signal end CKBO. In the data refreshing phase T10, the first noise reduction clock pulse signal loaded by the first noise reduction clock signal end CKO is a clock pulse signal having a high level and a low level that are switched, and the second noise reduction clock pulse signal loaded by the second noise reduction clock signal end CKBO is also a clock pulse signal having a high level and a low level that are switched. In addition, the first noise reduction clock pulse signal and the second noise reduction clock pulse signal have the same period and a phase difference of a ½ period. For example, a duty cycle of the first noise reduction clock pulse signal is the same as a duty cycle of the second noise reduction clock pulse signal, and the duty cycle is greater than 50%. Certainly, in actual use, specific implementation modes of the first noise reduction clock pulse signal and the second noise reduction clock pulse signal may be designed and determined according to actual use requirements, which are not limited herein.

In some examples, as shown in FIG. 3, the first clock period of the first noise reduction clock pulse signal may be the same as the second clock period of the first control clock pulse signal, that is, the first clock period may be the same as the second clock period. Furthermore, the duty cycle of the first noise reduction clock pulse signal may be the same as the duty cycle of the first control clock pulse signal. For example, a falling edge of the first noise reduction clock pulse signal is aligned with a rising edge of a second control clock pulse signal. A falling edge of the second noise reduction clock pulse signal is aligned with a rising edge of the first control clock pulse signal. Certainly, in actual use, relations between the first noise reduction clock pulse signal, the second noise reduction clock pulse signal, the first control clock pulse signal and the second control clock pulse signal may be designed and determined according to actual requirements, which are not limited herein.

During specific implementation, in the embodiments of the present disclosure, in the data holding phase, the first set signal is loaded to the control clock signal end, and the first set signal has the first set level. The control clock pulse level is the same as the first set level, and the maintaining duration of the first set level in the first clock period is longer than the maintaining duration of the control clock pulse level in the first clock period. For example, as shown in FIGS. 1 and 3, ck represents a signal loaded by the first control clock signal end CK, and ckb represents a signal loaded by the second control clock signal end CKB. In the data holding phase T20, the first set signal of the fixed voltage signal is loaded to the first control clock signal end CK. For example, when the first set level is the first level, a control clock pulse level of the first control clock pulse signal loaded by the first control clock signal end CK and a control clock pulse level of the second control clock pulse signal loaded by the second control clock signal end CKB are also first levels. With the first level as a low level as an example, as shown in FIG. 3, when the first set signal is kept to have a low level in the data holding phase, that is, the signal loaded by the first control clock signal end CK is kept to have a low level in the data holding phase, and the signal loaded by the second control clock signal end CKB is kept to have a low level in the data holding phase, the maintaining duration of the first set level in the first clock period may be longer than the maintaining duration of the control clock pulse level in the first clock period, such that power consumption of the shift register may be reduced.

Figure 6:
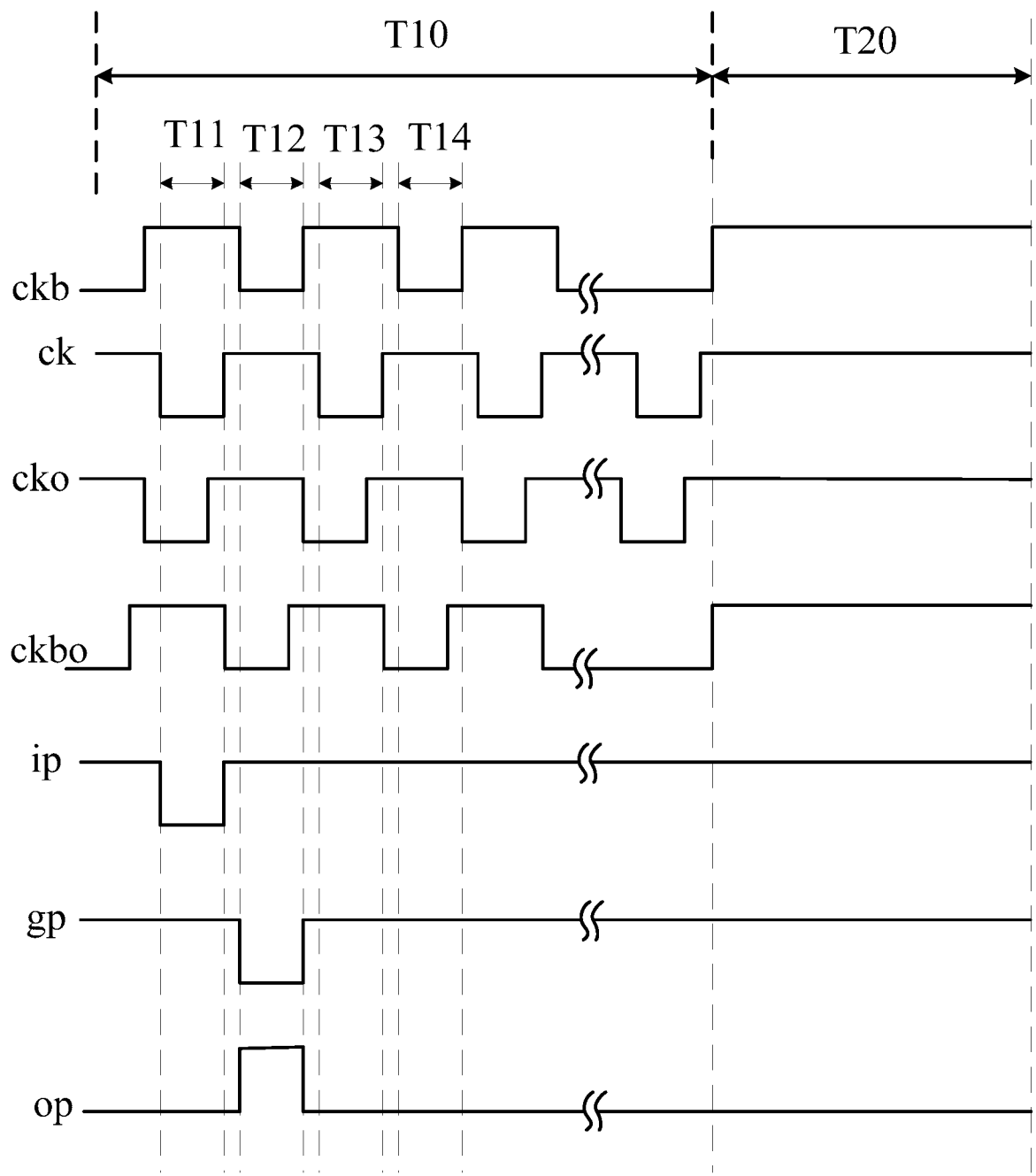
FIG. 6 shows still some signal sequence diagrams provided in an embodiment of the present disclosure.

For example, when the first set level is the second level, the control clock pulse level is also the second level. With the second level as a high level as an example, as shown in FIG. 6, when the first set signal is kept to have a high level in the data holding phase, the maintaining duration of the first set level in the first clock period may be longer than the maintaining duration of the control clock pulse level in the first clock period, such that power consumption of the shift register may be reduced.

During specific implementation, in the embodiments of the present disclosure, in the data holding phase, the second set signal is loaded to the noise reduction clock signal end, and the second set signal has the second set level. The noise reduction clock pulse level is the same as the second set level, and the maintaining duration of the second set level in the second clock period is longer than the maintaining duration of the noise reduction clock pulse level in the second clock period. For example, as shown in FIGS. 1 and 3, the second set signal may be a fixed voltage signal. For example, when the second set level is the first level, the noise reduction clock pulse level is also the first level. With the first level as a low level as an example, as shown in FIG. 3, when the second set signal is kept to have a low level in the data holding phase, that is, the signal loaded by the first noise reduction clock signal end CKO is kept to have a low level in the data holding phase, and the signal loaded by the second noise reduction clock signal end CKBO is kept to have a low level in the data holding phase, such that power consumption of the shift register may be reduced.

For example, when the second set level is the second level, the noise reduction clock pulse level is also the second level. With the second level as a high level as an example, as shown in FIG. 6, when the second set signal is kept to have a high level in the data holding phase, the maintaining duration of the second set level in the second clock period may be longer than the maintaining duration of the noise reduction clock pulse level in the second clock period, such that power consumption of the shift register may be reduced.

With the shift register shown in FIG. 1 as an example below, by combining a signal sequence diagram shown in FIG. 3, a work process of the shift register provided in the embodiments of the present disclosure at the first refreshing frequency will be described. In the following description, 1 represents a high level and 0 represents a low level. It should be noted that 1 and 0 represent logic levels, which are merely for better illustration of a specific work process of the embodiment of the present disclosure, rather than a voltage applied to a gate electrode of each transistor during specific implementation.

Specifically, as shown in FIG. 3, at the first refreshing frequency, a display frame may include the data refreshing phase T10 and the data holding phase T20. It should be noted that the signal sequence diagram shown in FIG. 3 merely shows a work process of a shift register in a current display frame. Work processes of the shift register in other display frames are basically the same as the work process of the shift register in the current display frame, which will not be repeated herein.

The data refreshing phase T10 includes phases T11, T12, T13 and T14. Specifically, in T11, ip=0, ckb=1, ck=0, cko=0, ckbo=1. When ckb=1, the twelfth transistor M12 is turned off. When ck=0, the ninth transistor M9 is turned on, and a low-level signal of the first reference signal end VREF1 is supplied to the pull-down node PD, such that a signal of the pull-down node PD is a low-level signal, and then the seventh transistor M7 is controlled to be turned on. The turned-on seventh transistor M7 supplies a high-level signal of the second reference signal end VREF2 to the cascade signal end GP, such that the cascade signal end GP outputs a high-level signal. When ck=0, the eighth transistor M8 is turned on, and a low-level signal of the input signal end IP is supplied to the first pull-up node PU_1, such that a signal of the first pull-up node PU_1 is a low-level signal. Then, the tenth transistor M10 is controlled to be turned on, such that a low-level signal of the first control clock signal end CK is supplied to the pull-down node PD, and then a signal of the pull-down node PD is a low-level signal. When the first transistor M1 satisfies $V_{gs1}<V_{th1}$, the first transistor M1 is turned on. The turned-on first transistor M1 turns on the second pull-up node PU_2 and the first pull-up node PU_1, such that a signal of the second pull-up node PU_2 may be a low-level signal in time, and the sixth transistor M6 is controlled to be turned on; and a high-level signal of the second control clock signal end CKB is supplied to the cascade signal end GP, such that the cascade signal end GP outputs a high-level cascade signal. When the cascade signal end GP outputs a high-level signal, the second transistor M2 and the fourth transistor M4 may be controlled to be turned off. When cko=0, the third transistor M3 is turned on, and the low-level signal of the first reference signal end VREF1 is supplied to the gate electrode of the fifth transistor M5. Then, the fifth transistor M5 is controlled to be turned on, such that the low-level signal of the first reference signal end VREF1 is supplied to the drive signal end OP, and then the drive signal end OP outputs a low-level drive signal.

In T12, ip=1, ckb=0, ck=1, cko=1, ckbo=0. When ck=1, the ninth transistor M9 and the eighth transistor M8 are turned off. Under an effect of the third capacitor C3, the second pull-up node PU_2 is kept to have a low-level signal, the sixth transistor M6 is controlled to be turned on, and then a low-level signal of the second control clock signal end CKB is supplied to the cascade signal end GP, such that the cascade signal end GP outputs a low-level cascade signal. Under an effect of the third capacitor C3, a level of the second pull-up node PU_2 is lowered, and the sixth transistor M6 is controlled to be turned on as thoroughly as possible. Then, the low-level signal of the second control clock signal end CKB is supplied to the cascade signal end GP, such that the cascade signal end GP outputs the low-level cascade signal. In addition, in the phase, an electrode of the first transistor M1 coupled to the first pull-up node PU_1 is used as the source electrode thereof, such that the first transistor M1 cannot satisfy $V_{gs1}<V_{th1}$, the first transistor M1 may be turned off, then the level of the second pull-up node PU_2 may be kept stable, and unstable output of the cascade signal end GP due to rise of the level of the second pull-up node PU_2 caused by electric leakage may be avoided.

In addition, the tenth transistor M10 supplies a high-level signal of the first control clock signal end CK to the pull-down node PD under control of the signal of the first pull-up node PU_1, and the seventh transistor M7 is controlled to be turned off, such that an adverse influence on the signal output from the cascade signal end GP is avoided. When cko=1, the third transistor M3 is turned off. When the cascade signal end GP outputs a low-level signal, the second transistor M2 and the fourth transistor M4 may be controlled to be turned on. The turned-on second transistor M2 may supply the high-level signal of the second reference signal end VREF2 to the gate electrode of the fifth transistor M5, and the fifth transistor M5 is controlled to be turned off. The turned-on fourth transistor M4 may supply the high-level signal of the second reference signal end VREF2 to the drive signal end OP, such that the drive signal end OP outputs a high-level drive signal.

After T12 and before T13, when ckb=1, the twelfth transistor M12 is turned off. When ck=1, the ninth transistor M9 and the eighth transistor M8 are turned off. Under an effect of the third capacitor C3, the second pull-up node PU_2 is kept to have the low-level signal, the sixth transistor M6 is controlled to be turned on, and then the high-level signal of the second control clock signal end CKB is supplied to the cascade signal end GP, such that the cascade signal end GP outputs a high-level cascade signal, and the second transistor M2 and the fourth transistor M4 are controlled to be turned off. When the signal cko of the first noise reduction clock signal end CKO is converted from the high level to the low level, the third transistor M3 is turned on, the low-level signal of the first reference signal end VREF1 is supplied to the gate electrode of the fifth transistor M5. Then, the fifth transistor M5 is controlled to be turned on, such that the low-level signal of the first reference signal end VREF1 is supplied to the drive signal end OP, and then the drive signal end OP outputs the low-level drive signal.

In T13, ip=1, ckb=1, ck=0, cko=0, ckbo=1.

When ckb=1, the twelfth transistor M12 is turned off. When ck=0, the eighth transistor M8 and the ninth transistor M9 are turned on. The turned-on eighth transistor M8 supplies a high-level signal of the input signal end IP to the first pull-up node PU_1, such that the first pull-up node PU_1 has a high-level signal, and the tenth transistor M10 is controlled to be turned off. When the first reference signal end VREF1 has the low-level signal, the first transistor M1 is turned on, the high-level signal of the first pull-up node PU_1 is supplied to the second pull-up node PU_2, and then the sixth transistor M6 is controlled to be turned off. The turned-on ninth transistor M9 supplies the low-level signal of the first reference signal end VREF1 to the pull-down node PD, such that the signal of the pull-down node PD is the low-level signal, and then the seventh transistor M7 is controlled to be turned on. The turned-on seventh transistor M7 supplies the high-level signal of the second reference signal end VREF2 to the cascade signal end GP, such that the cascade signal end GP outputs the high-level signal, and the second transistor M2 and the fourth transistor M4 are controlled to be turned off. When cko=0, the third transistor M3 is turned on, and the low-level signal of the first reference signal end VREF1 may be supplied to the gate electrode of the fifth transistor M5. Then, the fifth transistor M5 is controlled to be turned on, such that the low-level signal of the first reference signal end VREF1 is supplied to the drive signal end OP, and then the drive signal end OP outputs the low-level drive signal. In addition, the first capacitor C1 and the second capacitor C2 keep a voltage difference between two ends thereof stable.

In T14, ip=1, ckb=0, ck=1, cko=1, ckbo=0.

When ck=1, the eighth transistor M8 and the ninth transistor M9 are turned off. Under an effect of the fourth capacitor C4, the pull-down node PD may be kept to have the low-level signal, the seventh transistor M7 is controlled to be turned on, and then the high-level signal of the second reference signal end VREF2 is supplied to the cascade signal end GP, such that the cascade signal end GP outputs the high-level signal, and the second transistor M2 and the fourth transistor M4 are controlled to be turned off. When cko=0, the third transistor M3 is turned on, and the low-level signal of the first reference signal end VREF1 may be supplied to the gate electrode of the fifth transistor M5. Then, the fifth transistor M5 is controlled to be turned on, such that the low-level signal of the first reference signal end VREF1 is supplied to the drive signal end OP, and then the drive signal end OP outputs the low-level drive signal. In addition, the eleventh transistor M11 and the twelfth transistor M12 are turned on, such that the first pull-up node PU_1 has the high-level signal, then the second pull-up node PU_2 has the high-level signal, and the sixth transistor M6 is controlled to be turned off.

After T14, work processes of T13 and T14 are repeatedly executed until a denoising and holding phase T21-1 is entered.

In the data holding phase T20, ip=1, ckb=0, ck=0, cko=0, ckbo=0. When ck=0, the eighth transistor M8 and the ninth transistor M9 are turned on. The turned-on eighth transistor M8 inputs the high-level signal of the input signal end IP into the first pull-up node PU_1, such that the first pull-up node PU_1 has the high-level signal, and the sixth transistor M6 is controlled to be turned off. The turned-on ninth transistor M9 supplies the low-level signal of the first reference signal end VREF1 to the pull-down node PD, such that the signal of the pull-down node PD is the low-level signal, and then the seventh transistor M7 is controlled to be turned on. The turned-on seventh transistor M7 supplies the high-level signal of the second reference signal end VREF2 to the cascade signal end GP, such that the cascade signal end GP outputs the high-level signal. When the cascade signal end GP outputs the high-level signal, the second transistor M2 and the fourth transistor M4 may be controlled to be turned off. When cko=0, the third transistor M3 is turned on, and the low-level signal of the first reference signal end VREF1 is supplied to the gate electrode of the fifth transistor M5. Then, the fifth transistor M5 is controlled to be turned on, such that the low-level signal of the first reference signal end VREF1 is supplied to the drive signal end OP, and then the drive signal end OP outputs the low-level drive signal.

It should be noted that in actual use, specific voltages of all the signals mentioned above may be designed and determined according to an actual use environment, which are not limited herein.

Figure 4:
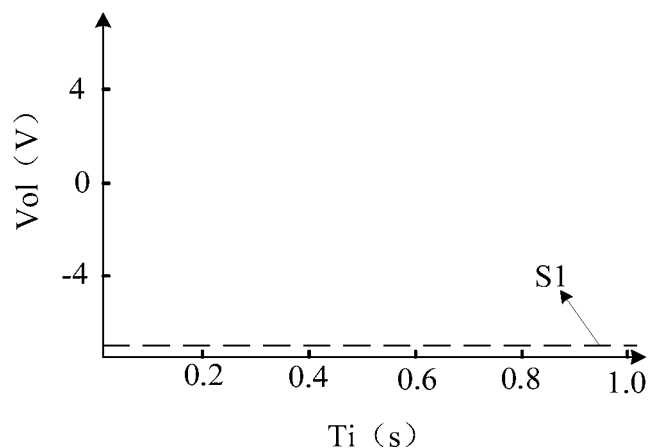
FIG. 4 shows some analogue simulation diagrams provided in an embodiment of the present disclosure.

Furthermore, according to the signal sequence diagram shown in FIG. 3, analogue simulation is conducted on a signal output from the drive signal end OP of the shift register shown in FIG. 1, and an analogue simulation diagram is shown in FIG. 4. In FIG. 4, an abscissa represents time, an ordinate represents voltage, and S1 represents a signal subjected to analogue simulation on the drive signal end OP of the shift register shown in FIG. 1 according to the signal sequence diagram shown in FIG. 3. With reference to FIGS. 3 and 4, in the embodiments of the present disclosure, the first set signal and the second set signal in the data holding phase are set, such that the drive signal end OP may output a signal stably.

In addition, the shift register shown in FIG. 1 is further driven to work according to the signal sequence diagram shown in FIG. 3, and power consumption of the shift register is detected to be 0.4 mW during work in the data holding phase T20. Therefore, power consumption of the shift register may also be within an acceptable range.

With the shift register shown in FIG. 1 as an example below, by combining the signal sequence diagram shown in FIG. 5, a work process of the shift register provided in the embodiments of the present disclosure at the second refreshing frequency will be described. In the following description, 1 represents a high-level signal and 0 represents a low-level signal. It should be noted that 1 and 0 represent logic levels, which are merely for better illustration of a specific work process of the embodiments of the present disclosure, rather than a voltage applied to a gate electrode of each transistor during specific implementation.

Figure 5:
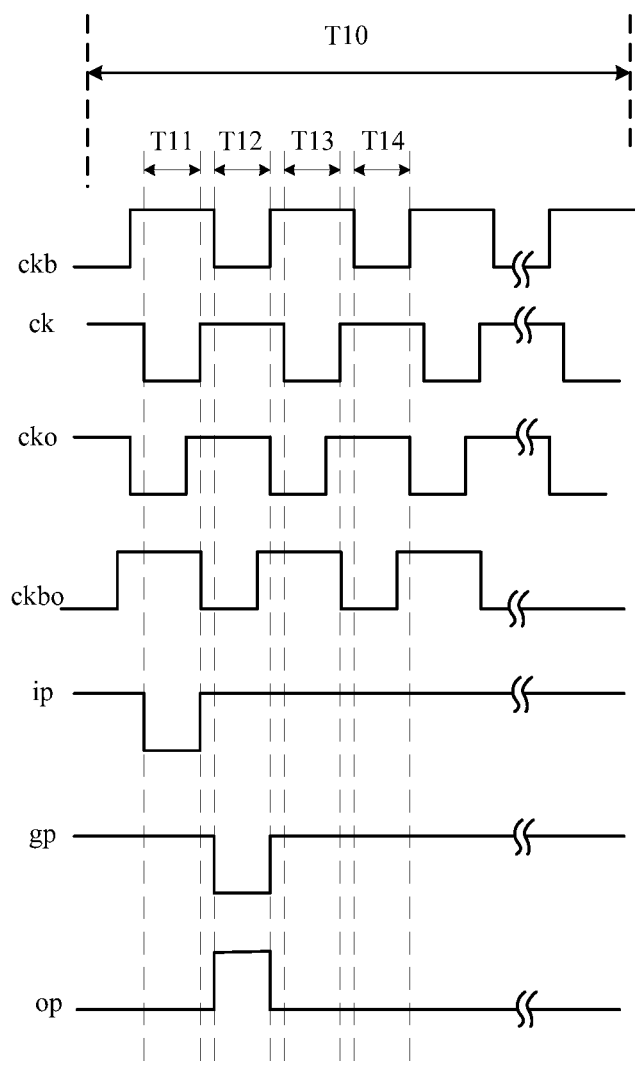
FIG. 5 shows some other signal sequence diagrams provided in an embodiment of the present disclosure.

Specifically, as shown in FIG. 5, at the second refreshing frequency, a display frame may include the data refreshing phase T10. It should be noted that the signal sequence diagram shown in FIG. 5 merely shows a work process of a shift register in a current display frame. Work processes of the shift register in other display frames are basically the same as the work process of the shift register in the current display frame, which will not be repeated herein.

The data refreshing phase T10 includes phases T11, T12, T13 and T14. In addition, a work process of the shift register provided in the embodiments of the present disclosure in the signal sequence diagram shown in FIG. 5 is basically the same as a work process of the shift register in the data refreshing phase T10 in the signal sequence diagram shown in FIG. 3, which will not be repeated herein.

With the shift register shown in FIG. 1 as an example below, by combining a signal sequence diagram shown in FIG. 6, a work process of the shift register provided in the embodiments of the present disclosure at the first refreshing frequency will be described.

Specifically, as shown in FIG. 6, at the first refreshing frequency, a display frame may include the data refreshing phase T10 and the data holding phase T20. It should be noted that the signal sequence diagram shown in FIG. 6 merely shows a work process of a shift register in a current display frame. Work processes of the shift register in other display frames are basically the same as the work process of the shift register in the current display frame, which will not be repeated herein.

The data refreshing phase T10 includes phases T11, T12, T13 and T14. In addition, a work process of the shift register provided in the embodiments of the present disclosure in the signal sequence diagram shown in FIG. 6 is basically the same as a work process of the shift register in the data refreshing phase T10 in the signal sequence diagram shown in FIG. 3, which will not be repeated herein.

In the data holding phase T20, ip=1, ckb=1, ck=1, cko=1, ckbo=1. When ck=1, the eighth transistor M8 and the ninth transistor M9 are turned off. Under an effect of the third capacitor C3, the second pull-up node PU_2 is kept to have the high-level signal, and the sixth transistor M6 is controlled to be turned off. Under an effect of the fourth capacitor C4, the pull-down node PD is kept to have the low-level signal, and the seventh transistor M7 is controlled to be turned on. The turned-on seventh transistor M7 supplies the high-level signal of the second reference signal end VREF2 to the cascade signal end GP, such that the cascade signal end GP outputs the high-level signal. When the cascade signal end GP outputs the high-level signal, the second transistor M2 and the fourth transistor M4 may be controlled to be turned off. When cko=1, the third transistor M3 is turned off. Under an effect of the second capacitor C2, the fifth transistor M5 may be controlled to be turned on, such that the low-level signal of the first reference signal end VREF1 is supplied to the drive signal end OP, and then the drive signal end OP outputs the low-level drive signal.

The embodiments of the present disclosure further provide some other driving methods, which are varied with respect to the implementation modes in the embodiments mentioned above. Herein, merely differences between the embodiment and the embodiments mentioned above will be described, and the same part will not be repeated herein.

Figure 7:
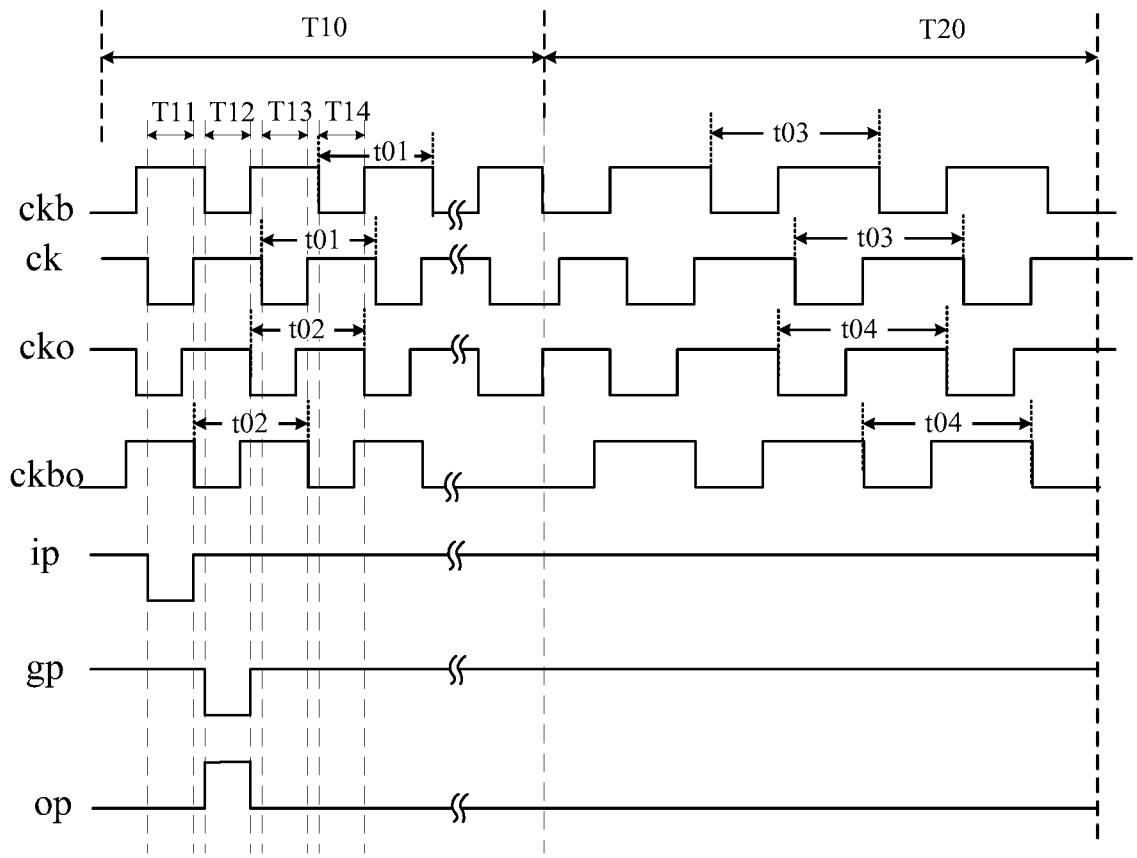
FIG. 7 shows still some signal sequence diagrams provided in an embodiment of the present disclosure.

During specific implementation, in the embodiment of the present disclosure, as shown in FIG. 7, when the first set signal is the clock pulse signal, the first set level may be one of the first level and the second level, that is, the first set signal may also be the clock pulse signal having the high level and the low level that are switched. The first set signal has a third clock period t03, the third clock period t03 includes a duration of one first level and a duration of one second level of the first set signal, and the third clock period t03 may be longer than the first clock period t01.

For example, the first set level is the first level. A maintaining duration of the first level of the first set signal in the first clock period is longer than a maintaining duration of the first level of the control clock pulse signal in the first clock period. For example, as shown in FIG. 7, with the first level as the high level as an example, a maintaining duration of a high level in a period of the first set signal in the first clock period t01 is longer than a maintaining duration of a high level in a period of the control clock pulse signal in the first clock period t01. Furthermore, a maintaining duration of a high level in a period of the first set signal in the third clock period t03 is longer than the maintaining duration of the high level in the period of the control clock pulse signal in the first clock period t01.

For example, the first set level is the second level. A maintaining duration of the second level of the first set signal in the first clock period is longer than a maintaining duration of the second level of the control clock pulse signal in the first clock period. For example, as shown in FIG. 7, with the second level as the low level as an example, a maintaining duration of a low level in a period of the first set signal in the first clock period t01 is longer than a maintaining duration of a low level in a period of the control clock pulse signal in the first clock period t01. Furthermore, a maintaining duration of a low level in a period of the first set signal in the third clock period t03 is longer than the maintaining duration of the low level in the period of the control clock pulse signal in the first clock period t01.

During specific implementation, in the embodiments of the present disclosure, as shown in FIG. 7, when the second set signal is the clock pulse signal, the second set level may be one of the first level and the second level, that is, the second set signal may also be the clock pulse signal having the high level and the low level that are switched. The second set signal has a fourth clock period t04, the fourth clock period t04 includes a duration of one first level and a duration of one second level of the second set signal, and the fourth clock period t04 may be longer than the second clock period t02.

For example, the second set level is the first level. A maintaining duration of the first level of the second set signal in the second clock period is longer than a maintaining duration of the first level of the noise reduction clock pulse signal in the second clock period. For example, as shown in FIG. 7, with the first level as the high level as an example, a maintaining duration of a high level in a period of the second set signal in the second clock period t02 is longer than a maintaining duration of a high level in a period of the noise reduction clock pulse signal in the second clock period t02. Furthermore, a maintaining duration of a high level in a period of the second set signal in the fourth clock period t04 is longer than the maintaining duration of the high level in the period of the noise reduction clock pulse signal in the second clock period t02.

For example, the second set level is the second level. A maintaining duration of the second level of the second set signal in the second clock period is longer than a maintaining duration of the second level of the noise reduction clock pulse signal in the second clock period. For example, as shown in FIG. 7, with the second level as the low level as an example, a maintaining duration of a low level in a period of the second set signal in the second clock period t02 is longer than a maintaining duration of a low level in a period of the noise reduction clock pulse signal in the second clock period t02. Furthermore, a maintaining duration of a low level in a period of the second set signal in the fourth clock period t04 is longer than the maintaining duration of the low level in the period of the noise reduction clock pulse signal in the second clock period t02.

For example, the third clock period t03 of the first set signal may be the same as the fourth clock period t04 of the second set signal, such that coupling interference of signals may be reduced.

With the shift register shown in FIG. 1 as an example below, by combining a signal sequence diagram shown in FIG. 7, a work process of the shift register provided in the embodiments of the present disclosure at the first refreshing frequency will be described. In the following description, 1 represents a high-level signal and 0 represents a low-level signal. It should be noted that 1 and 0 represent logic levels, which are merely for better illustration of a specific work process of the embodiment of the present disclosure, rather than a voltage applied to a gate electrode of each transistor during specific implementation.

Specifically, as shown in FIG. 7, at the first refreshing frequency, a display frame may include the data refreshing phase T10 and the data holding phase T20. It should be noted that the signal sequence diagram shown in FIG. 7 merely shows a work process of a shift register in a current display frame. Work processes of the shift register in other display frames are basically the same as the work process of the shift register in the current display frame, which will not be repeated herein.

A work process in the data refreshing phase T10 may refer to the work process mentioned above, which will not be repeated herein.

A work process in the data holding phase T20 is basically the same as that after T14 in the data refreshing phase T10. The difference is that frequency of switching between the high level and the low level of signal ckb, signal ck, signal cko and signal ckbo in the data holding phase T20 is lower than that in the data refreshing phase T10, so a specific work process will not be repeated herein.

Figure 8:
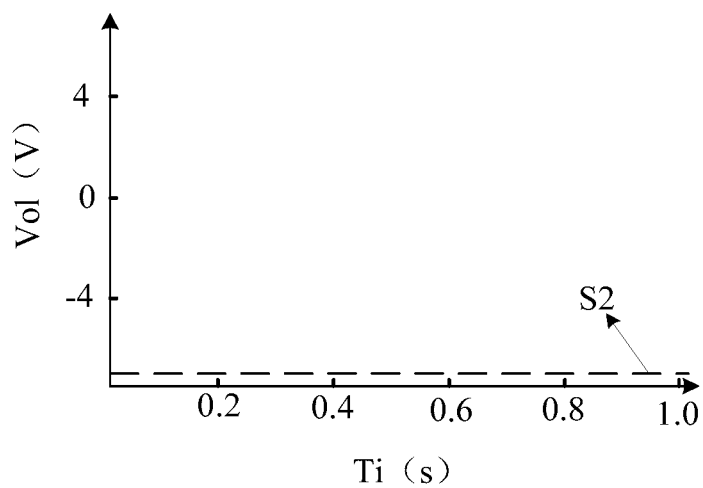
FIG. 8 shows some other analogue simulation diagrams provided in an embodiment of the present disclosure.

Furthermore, according to the signal sequence diagram shown in FIG. 7, analogue simulation is conducted on a signal output from the drive signal end OP of the shift register shown in FIG. 1, and an analogue simulation diagram is shown in FIG. 8. In FIG. 8, an abscissa represents time, an ordinate represents voltage, and S2 represents a signal subjected to analogue simulation on the drive signal end OP of the shift register shown in FIG. 1 according to the signal sequence diagram shown in FIG. 7. With reference to FIGS. 7 and 8, in the embodiments of the present disclosure, the first set signal and the second set signal in the data holding phase are set, such that the drive signal end OP may output a signal stably.

In addition, the shift register shown in FIG. 1 is further driven to work according to the signal sequence diagram shown in FIG. 7, and power consumption of the shift register is detected to be 0.7 mW during work in the data holding phase T20. Therefore, even if a clock pulse is inserted in the data holding phase T20, power consumption of the shift register may also be within an acceptable range.

Figure 9:
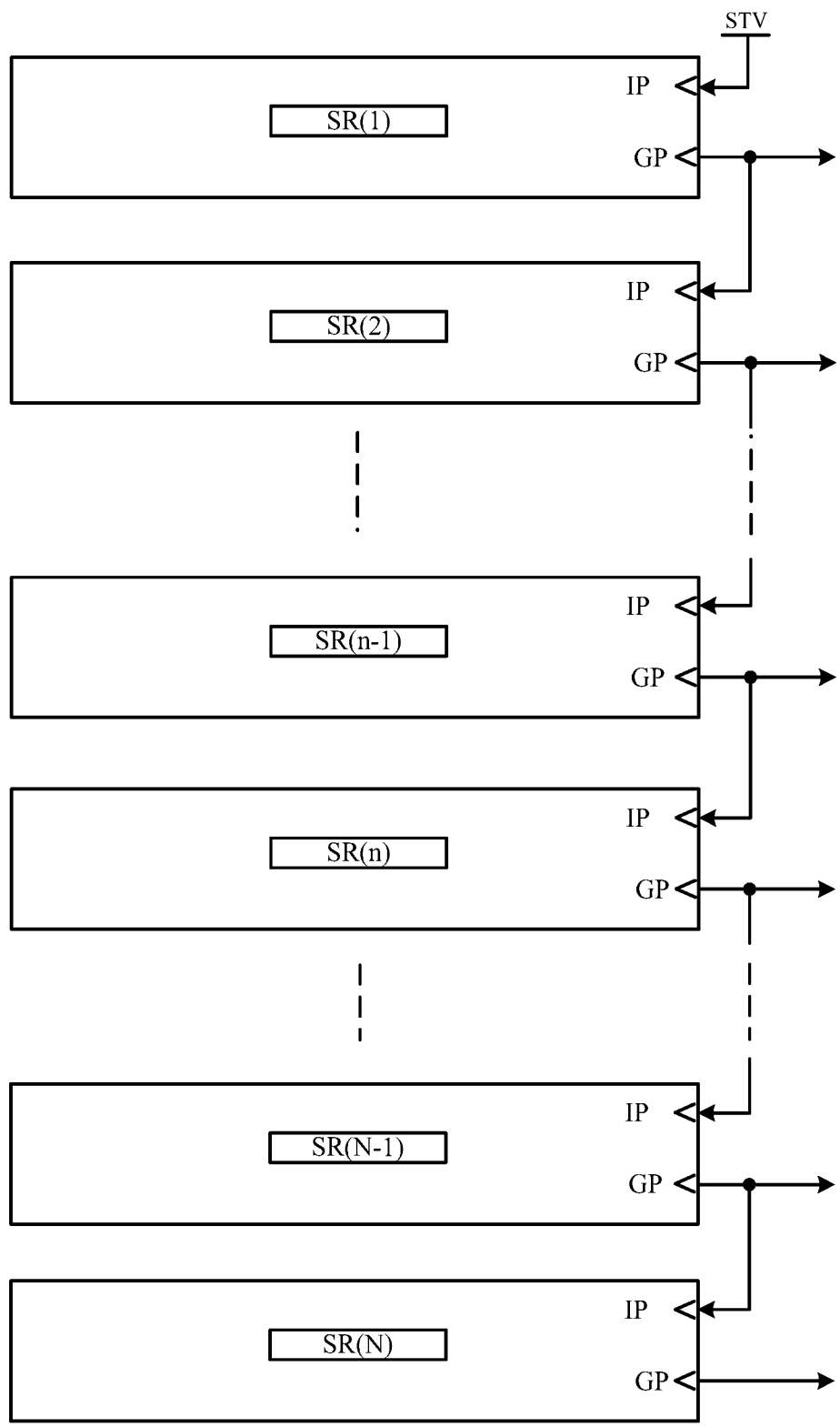
FIG. 9 is a schematic structural diagram of some gate drive circuits provided in an embodiment of the present disclosure.

The embodiments of the present disclosure further provide a gate drive circuit. As shown in FIG. 9, the gate drive circuit includes any of a plurality of above cascaded shift registers provided in the embodiments of the present disclosure: SR(1), SR(2) . . . SR(n−1), SR(n) . . . SR(N−1), SR(N) (N shift registers in total, 1≤n≤N, and n is an integer). An input signal end IP of a first shift register SR(1) is configured to be coupled to a frame trigger signal end (STV).

In every two adjacent shift registers, an input signal end IP of a next shift register SR(n) is configured to be coupled to a cascade signal output end GP of a previous shift register SR(n−1).

Specifically, a specific structure and functions of each of the shift registers in the gate drive circuit mentioned above are the same as those of the shift register of the present disclosure, which will not be repeated herein. The gate drive circuit may be configured in a liquid crystal display panel or an electroluminescent display panel, which is not limited herein.

Specifically, in the gate drive circuit provided in the embodiments of the present disclosure, a first reference signal end VREF1 of each of the shift registers is coupled to a same first direct current signal end, and a second reference signal end VREF2 of each of the shift registers is coupled to a same second direct current signal end.

Specifically, in the gate drive circuit provided in the embodiments of the present disclosure, first control clock signal ends CK of odd-numbered shift registers and second control clock signal ends CKB of even-numbered shift registers are coupled to the same clock end, which is a first control clock end. Second control clock signal ends CKB of the odd-numbered shift registers and first control clock signal ends CK of the even-numbered shift registers are coupled to the same clock end, which is a second control clock end.

Specifically, in the gate drive circuit provided in the embodiments of the present disclosure, first noise reduction clock signal ends CKO of odd-numbered shift registers and second noise reduction clock signal ends CKBO of even-numbered shift registers are coupled to the same clock end, which is a first noise reduction clock end. Second noise reduction clock signal ends CKBO of the odd-numbered shift registers and first noise reduction clock signal ends CKO of the even-numbered shift registers are coupled to the same clock end, which is a second noise reduction clock end.

Based on the same disclosed concept, the embodiments of the present disclosure further provide a driving circuit for a shift register. At first refreshing frequency, a display frame includes a data refreshing phase and a data holding phase.

The driving circuit is configured to: in the data refreshing phase, load an input signal having a pulse level to an input signal end, load a control clock pulse signal to a control clock signal end, load a noise reduction clock pulse signal to a noise reduction clock signal end, load a fixed voltage signal having a first level to a first reference signal end, load a fixed voltage signal having a second level to a second reference signal end, control a cascade signal end of the shift register to output a cascade signal having a pulse level, and control a drive signal end of the shift register to output a drive signal having a pulse level; and in the data holding phase, load a fixed voltage signal to the input signal end, load a first set signal to the control clock signal end, load a second set signal to the noise reduction clock signal end, load the fixed voltage signal having the first level to the first reference signal end, load the fixed voltage signal having the second level to the second reference signal end, control the cascade signal end to output the fixed voltage signal having the second level, and control the drive signal end to output the fixed voltage signal having the first level.

The control clock pulse signal has the first level, the second level and a first clock period, the first set signal has a first set level, where the first clock period includes a duration of one first level and a duration of one second level of the control clock pulse signal, one of the first level and the second level of the control clock pulse signal is a control clock pulse level, the control clock pulse level is the same as the first set level, and a maintaining duration of the first set level in the first clock period is longer than that of the control clock pulse level in the first clock period; and/or, the noise reduction clock pulse signal has the first level, the second level and a second clock period, the second set signal has a second set level, where the second clock period includes a duration of one first level and a duration of one second level of the noise reduction clock pulse signal, one of the first level and the second level of the noise reduction clock pulse signal is a noise reduction clock pulse level, the noise reduction clock pulse level is the same as the second set level, and a maintaining duration of the second set level in the second clock period is longer than a maintaining duration of the noise reduction clock pulse level in the second clock period.

During specific implementation, in the embodiments of the present disclosure, at second refreshing frequency, a display frame includes the data refreshing phase. The driving circuit is further configured to: in the data refreshing phase, load the input signal having the pulse level to the input signal end, load the control clock pulse signal to the control clock signal end, load the noise reduction clock pulse signal to the noise reduction clock signal end, load the fixed voltage signal having the first level to the first reference signal end, load the fixed voltage signal having the second level to the second reference signal end, control the cascade signal end of the shift register to output the cascade signal having the pulse level, and control the drive signal end of the shift register to output the drive signal having the pulse level.

It should be noted that a work process of the driving circuit may refer to a process of the driving method mentioned above, which will not be repeated herein.

Based on the same disclosed concept, the embodiments of the present disclosure further provide a display panel. The display panel includes the gate drive circuit provided in the embodiments of the present disclosure and the driving circuit mentioned above. The driving circuit is electrically connected to a plurality of shift registers.

A problem solution principle of the display panel is similar to that of the driving circuit mentioned above, so implementation of the display panel may refer to implementation of the driving circuit mentioned above, which will not be repeated herein.

Based on the same disclosed concept, the embodiments of the present disclosure further provide a display device. The display device includes the display panel provided in the embodiments of the present disclosure. A problem solution principle of the display device is similar to that of the display panel mentioned above, so implementation of the display device may refer to implementation of the display panel mentioned above, which will not be repeated herein.

During specific implementation, the display device provided in the embodiments of the present disclosure may be a mobile phone, a tablet, a television, a display apparatus, a laptop, a digital photo frame, a navigator and other products or components having display functions. Other essential components of the display device will be understood by those of ordinary skill in the art, and will not be repeated herein, nor are they intended to be limiting of the present disclosure.

Although preferred embodiments of the present disclosure are described, those of ordinary skill in the art can make additional changes and modifications to the embodiments once they learn the basic inventive concept. Therefore, the appended claims are intended to be interpreted as including the preferred embodiments and all changes and modifications falling within the scope of the present disclosure.

Apparently, those of ordinary skill in the art can make various modifications and variations to the embodiments of the present disclosure without departing from the spirit and scope of the embodiments of the present disclosure. In this way, if the modifications and variations of the embodiments of the present disclosure fall within the scope of the claims of the present disclosure and their equivalent technologies, the present disclosure is also intended to include the modifications and variations.

What is claimed is:

1. A driving method for a shift register, comprising: under a condition that at first refreshing frequency, a display frame comprises a data refreshing phase and a data holding phase,
   in the data refreshing phase, loading an input signal having a pulse level to an input signal end, loading a control clock pulse signal to a control clock signal end, loading a noise reduction clock pulse signal to a noise reduction clock signal end, loading a fixed voltage signal having a first level to a first reference signal end, loading a fixed voltage signal having a second level to a second reference signal end, controlling a cascade signal end of the shift register to output a cascade signal having a pulse level, and controlling a drive signal end of the shift register to output a drive signal having a pulse level; and
   in the data holding phase, loading a fixed voltage signal to the input signal end, loading a first set signal to the control clock signal end, loading a second set signal to the noise reduction clock signal end, loading the fixed voltage signal having the first level to the first reference signal end, loading the fixed voltage signal having the second level to the second reference signal end, controlling the cascade signal end to output the fixed voltage signal having the second level, and controlling the drive signal end to output the fixed voltage signal having the first level,
   wherein the control clock pulse signal has the first level, the second level and a first clock period, the first set signal has a first set level, wherein the first clock period comprises a duration of one first level and a duration of one second level of the control clock pulse signal, one of the first level and the second level of the control clock pulse signal is a control clock pulse level, the control clock pulse level is the same as the first set level, and a maintaining duration of the first set level in the first clock period is longer than a maintaining duration of the control clock pulse level in the first clock period; and/or,
   the noise reduction clock pulse signal has the first level, the second level and a second clock period, the second set signal has a second set level, wherein the second clock period comprises a duration of one first level and a duration of one second level of the noise reduction clock pulse signal, one of the first level and the second level of the noise reduction clock pulse signal is a noise reduction clock pulse level, the noise reduction clock pulse level is the same as the second set level, and a maintaining duration of the second set level in the second clock period is longer than a maintaining duration of the noise reduction clock pulse level in the second clock period.

2. The driving method according to claim 1, wherein the first set signal is a clock pulse signal, and the first set level is one of the first level and the second level.

3. The driving method according to claim 2, wherein a third clock period of the first set signal is longer than the first clock period, wherein the third clock period comprises a duration of one first level and a duration of one second level of the first set signal.

4. The driving method according to claim 2 or 3, wherein a maintaining duration of the first level of the first set signal in the first clock period is longer than a maintaining duration of the first level of the control clock pulse signal in the first clock period; and
a maintaining duration of the second level of the first set signal in the first clock period is longer than a maintaining duration of the second level of the control clock pulse signal in the first clock period.

5. The driving method according to claim 1, wherein the second set signal is a clock pulse signal, and the second set level is one of the first level and the second level.

6. The driving method according to claim 5, wherein a fourth clock period of the second set signal is longer than the second clock period, and
the fourth clock period comprises a duration of one first level and a duration of one second level of the second set signal.

7. The driving method according to claim 5, wherein a maintaining duration of the first level of the second set signal in the second clock period is longer than a maintaining duration of the first level of the noise reduction clock pulse signal in the second clock period; and
a maintaining duration of the second level of the second set signal in the second clock period is longer than a maintaining duration of the second level of the noise reduction clock pulse signal in the second clock period.

8. The driving method according to claim 6, wherein a third clock period of the first set signal is the same as the fourth clock period of the second set signal.

9. The driving method according to claim 1, wherein at least one of the first set signal and the second set signal is a fixed voltage signal; and
at least one of the first set level and the second set level is one of the first level and the second level.

10. The driving method according to claim 1, wherein the first level is a high level, and the second level is a low level; or, the first level is a low level, and the second level is a high level.

11. The driving method according to claim 1, further comprising: under a condition that at second refreshing frequency, a display frame comprises the data refreshing phase,
in the data refreshing phase, loading the input signal having the pulse level to the input signal end, loading the control clock pulse signal to the control clock signal end, loading the noise reduction clock pulse signal to the noise reduction clock signal end, loading the fixed voltage signal having the first level to the first reference signal end, loading the fixed voltage signal having the second level to the second reference signal end, controlling the cascade signal end of the shift register to output the cascade signal having the pulse level, and controlling the drive signal end of the shift register to output the drive signal having the pulse level.

12. The driving method according to claim 3, wherein a maintaining duration of the first level of the first set signal in the first clock period is longer than a maintaining duration of the first level of the control clock pulse signal in the first clock period; and
a maintaining duration of the second level of the first set signal in the first clock period is longer than a maintaining duration of the second level of the control clock pulse signal in the first clock period.

13. The driving method according to claim 6, wherein a maintaining duration of the first level of the second set signal in the second clock period is longer than a maintaining duration of the first level of the noise reduction clock pulse signal in the second clock period; and
a maintaining duration of the second level of the second set signal in the second clock period is longer than a maintaining duration of the second level of the noise reduction clock pulse signal in the second clock period.

14. The driving method according to claim 7, wherein a third clock period of the first set signal is the same as the fourth clock period of the second set signal.

15. A driving circuit for a shift register, wherein at first refreshing frequency, a display frame comprises a data refreshing phase and a data holding phase; and
the driving circuit is configured to:
in the data refreshing phase, load an input signal having a pulse level to an input signal end, load a control clock pulse signal to a control clock signal end, load a noise reduction clock pulse signal to a noise reduction clock signal end, load a fixed voltage signal having a first level to a first reference signal end, load a fixed voltage signal having a second level to a second reference signal end, control a cascade signal end of the shift register to output a cascade signal having a pulse level, and control a drive signal end of the shift register to output a drive signal having a pulse level; and
in the data holding phase, load a fixed voltage signal to the input signal end, load a first set signal to the control clock signal end, load a second set signal to the noise reduction clock signal end, load the fixed voltage signal having the first level to the first reference signal end, load the fixed voltage signal having the second level to the second reference signal end, control the cascade signal end to output the fixed voltage signal having the second level, and control the drive signal end to output the fixed voltage signal having the first level,
wherein the control clock pulse signal has the first level, the second level and a first clock period, the first set signal has a first set level, wherein the first clock period comprises a duration of one first level and a duration of one second level of the control clock pulse signal, one of the first level and the second level of the control clock pulse signal is a control clock pulse level, the control clock pulse level is the same as the first set level, and a maintaining duration of the first set level in the first clock period is longer than a maintaining duration of the control clock pulse level in the first clock period; and/or,
the noise reduction clock pulse signal has the first level, the second level and a second clock period, the second set signal has a second set level, wherein the second clock period comprises a duration of one first level and a duration of one second level of the noise reduction clock pulse signal, one of the first level and the second level of the noise reduction clock pulse signal is a noise reduction clock pulse level, the noise reduction clock pulse level is the same as the second set level, and a maintaining duration of the second set level in the second clock period is longer than a maintaining duration of the noise reduction clock pulse level in the second clock period.

16. The driving circuit according to claim 15, wherein at second refreshing frequency, a display frame comprises the data refreshing phase; and the driving circuit is further configured to:

in the data refreshing phase, load the input signal having the pulse level to the input signal end, load the control clock pulse signal to the control clock signal end, load the noise reduction clock pulse signal to the noise reduction clock signal end, load the fixed voltage signal having the first level to the first reference signal end, load the fixed voltage signal having the second level to the second reference signal end, control the cascade signal end of the shift register to output the cascade signal having the pulse level, and control the drive signal end of the shift register to output the drive signal having the pulse level.

17. A display panel, comprising a gate drive circuit and the driving circuit according to claim 15, wherein the gate drive circuit comprises a plurality of shift registers cascaded; and the driving circuit is electrically connected to the plurality of shift registers.

18. A display device, comprising the display panel according to claim 17.

* * * * *